(12) United States Patent
Asada et al.

(10) Patent No.: US 8,391,417 B2
(45) Date of Patent: Mar. 5, 2013

(54) RECEIVER CIRCUITRY AND RELATED CALIBRATION METHODS

(75) Inventors: Gladney Asada, Santa Clara, CA (US); Jeffrey Cooper, Ft. Collins, CO (US)

(73) Assignee: Advanced Micro Devices, Inc., Austin, TX (US)

( * ) Notice: Subject to any disclaimer, the term of this patent is extended or adjusted under 35 U.S.C. 154(b) by 195 days.

(21) Appl. No.: 12/899,191

(22) Filed: Oct. 6, 2010

(65) Prior Publication Data

US 2012/0086494 A1    Apr. 12, 2012

(51) Int. Cl.
*H03K 9/00*    (2006.01)
*H03K 3/00*    (2006.01)

(52) U.S. Cl. ......... 375/316; 327/307; 327/306; 327/100

(58) Field of Classification Search .................. 375/316; 327/307, 306, 100
See application file for complete search history.

(56) References Cited

U.S. PATENT DOCUMENTS

| | | | |
|---|---|---|---|
| 7,720,141 B2 | 5/2010 | Fang et al. | |
| 2004/0070409 A1* | 4/2004 | Mobley | 324/672 |
| 2008/0143665 A1* | 6/2008 | Nishimura | 345/96 |

* cited by examiner

*Primary Examiner* — David C. Payne
*Assistant Examiner* — Brian J Stevens
(74) *Attorney, Agent, or Firm* — Ingrassia, Fisher & Lorenz, P.C.

(57) ABSTRACT

Apparatus and methods are provided for calibrating and operating a receiver circuit. An exemplary method comprises the steps of applying a first voltage offset to a first input of an amplifier circuit, generating an output signal at an output of the amplifier circuit based on the first voltage offset and a second voltage offset at a second input of the amplifier circuit, adjusting the second voltage offset based on the output signal, and maintaining the second voltage offset at a constant voltage when the output signal is indicative of the second voltage offset cancelling the first voltage offset.

17 Claims, 4 Drawing Sheets

RECEIVER CIRCUITRY AND RELATED CALIBRATION METHODS

TECHNICAL FIELD

Embodiments of the subject matter described herein relate generally to electronic circuits, and more particularly, to receiver circuitry and related calibration methods.

BACKGROUND

Many modern electronic devices include multiple processors (e.g., data processors, graphics processors, signal processors, and the like) that cooperate to perform various tasks, functions, or operations. Frequently, data or information must be communicated from one processor to a second processor to enable the second processor to complete a particular task, function, or operation.

Intersymbol interference is one problem encountered when communicating from one processor to another processor over a communication channel. Decision feedback equalization (DFE) is one technique for mitigating intersymbol interference. In DFE, a reference voltage is used to adjust the voltage of the input signal (or alternatively, the threshold voltage of an amplifier receiving the input signal) to account for the preceding bit(s) of data received by the receiver. However, due to manufacturing process variations, it is difficult to produce a desired reference voltage in an accurate and repeatable manner, thereby reducing yield.

BRIEF SUMMARY

In general, an apparatus for a receiver circuit is provided. The receiver circuit includes a first amplifier and a control module. The first amplifier is configured to generate an output signal based on a first voltage and a reference voltage. The control module is configured to set the first voltage to a first target offset voltage, and while the first voltage is equal to the first target offset voltage, adjust the reference voltage based on the output signal and identify a first calibrated reference voltage offset for the first amplifier when the reference voltage cancels the first target offset voltage.

In another embodiment, an apparatus is provided for a computing module. The computing module includes receiver circuitry and a processing system. The receiver circuitry includes an input for receiving an input signal, a digital-to-analog converter (DAC) configured to provide a calibrated reference voltage offset, an amplifier configured to generate an output signal based on a difference between the input signal and the calibrated reference voltage offset, and a capacitor arrangement configured electrically in series between the input and the amplifier. The processing system is configured to receive the output signal from the receiver circuitry.

In one embodiment, a method is provided for operating a receiver circuit. The method comprises the steps of applying a first voltage offset to a first input of an amplifier circuit, generating an output signal at an output of the amplifier circuit based on the first voltage offset and a second voltage offset at a second input of the amplifier circuit, adjusting the second voltage offset based on the output signal, and maintaining the second voltage offset at a constant voltage when the output signal is indicative of the second voltage offset cancelling the first voltage offset.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to calibrating amplifier circuits in the front end of a receiver circuit for predetermined voltage offsets to support an equalization scheme, such as decision feedback equalization (DFE), to minimize intersymbol interference (ISI). As described in greater detail below, in an exemplary embodiment, each amplifier circuit in the receiver front end is associated with a digital-to-analog converter (DAC) that provides a calibrated reference voltage offset to reference inputs of the respective amplifier circuit to provide a desired amplifier threshold for use in equalizing the signals received by the receiver circuit.

Figure 1:
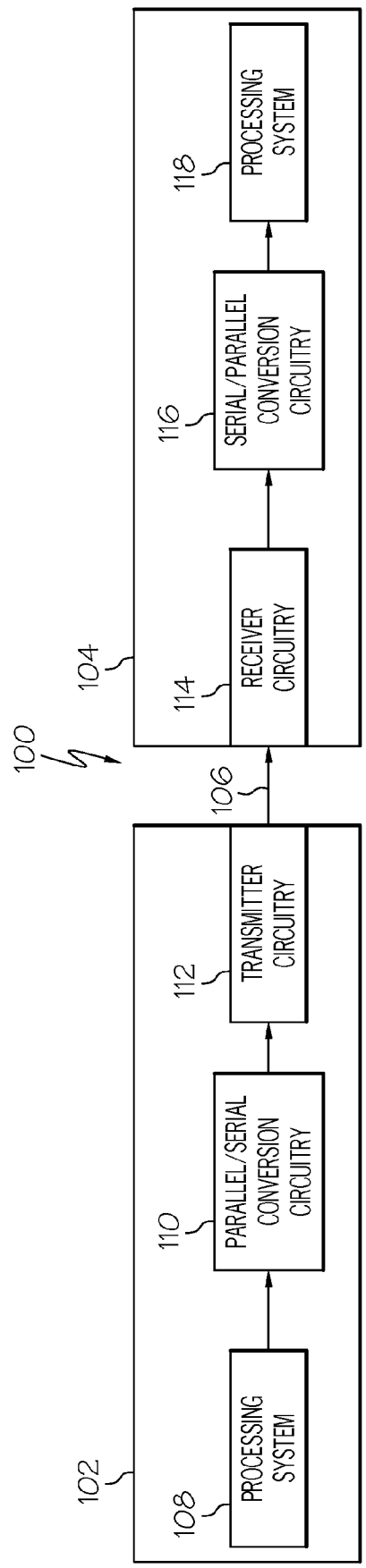
FIG. 1 is a block diagram of a system for communicating between two computing modules in accordance with one embodiment.

FIG. 1 depicts an exemplary embodiment of a system 100 for communicating data over a serial interface 106 from a first computing module 102, such as a processor, central processing unit (CPU), graphics processing unit (GPU), or the like, to a second computing module 104 (e.g., another processor, CPU, GPU, or the like). It should be understood that FIG. 1 is a simplified representation of a system 100 for purposes of explanation and ease of description, and FIG. 1 is not intended to limit the subject matter in any way. Practical embodiments of system 100 may include other devices and components for providing additional functions and features, and/or the computing modules 102, 104 may be part of a larger system, as will be understood. In this regard, it should be understood that although the subject matter may be described in the context of communicating data from the first computing module 102 to the second computing module 104, the subject matter may be implemented in a like manner for communicating data from the second computing module 104 to the first computing module 102 or for communicating data to other modules not illustrated in FIG. 1, and in some embodiments, the serial interface 106 may be utilized for bidirectional communication between computing modules 102, 104. Furthermore, although FIG. 1 depicts the computing modules 102, 104 as distinct elements (e.g., separate chips and/or device packages), in some embodiments, the computing modules 102, 104 may be implemented as part of a common device package.

In an exemplary embodiment, the first computing module 102 includes, without limitation, a processing system 108, parallel-to-serial conversion circuitry 110, and transmitter circuitry 112 configured to transmit or otherwise communicate serialized data over the serial interface 106. The processing system 108 generally represents the main processing core for the first computing module 102. In various embodiments, the processing system 108 may be realized using one or more arithmetic logic units (ALUs), one or more floating point units (FPUs), one or more memory elements (e.g., one or more caches), discrete gate or transistor logic, discrete hardware components, or any combination thereof. The processing system 108 is coupled to the parallel-to-serial conversion circuitry 110 and generates or otherwise provides parallelized (or multi-bit) data to be transmitted to the second computing module 104 to the parallel-to-serial conversion circuitry 110. The parallel-to-serial conversion circuitry 110 is coupled between the processing system 108 and the transmitter circuitry 112, and the parallel-to-serial conversion circuitry 110 generally represents the hardware components that are configured to convert parallel data from the processing system 108 to serialized data capable of being transmitted or otherwise communicated over the serial interface 106. The transmitter circuitry 112 generally represents the hardware components of the first computing module 102 that are configured to sequentially transmit individual bits of the serialized data from the output of parallel-to-serial conversion circuitry 110 over the serial interface 106. In an exemplary embodiment, the serial interface 106 is a differential serial interface, that is, the serial interface 106 includes a pair of communication channels, one for signals representative of the bits of the serialized data from the parallel-to-serial conversion circuitry 110 (e.g., the true channel) and one for complementary signals (e.g., the complementary channel). In this regard, the transmitter circuitry 112 is configured to transmit signals representative of the bits of the serialized data from the parallel-to-serial conversion circuitry 110 over the true channel of the serial interface 106 and transmit complementary signals over the complementary channel of the serial interface 106.

In the illustrated embodiment, the second computing module 104 includes, without limitation, receiver circuitry 114 for receiving data from the serial interface 106, serial-to-parallel conversion circuitry 116, and a second processing system 118. The receiver circuitry 114 generally represents the circuitry, logic, and/or hardware components of the second computing module 104 that are coupled to the serial interface 106 and configured to convert electrical signals on the serial interface 106 to serialized digital values. In an exemplary embodiment, the receiver circuitry 114 includes coupling capacitors configured between the serial interface 106 and the front end of the receiver circuitry 114 for attenuating low frequency signals on the serial interface 106, as described in greater detail below. The serial-to-parallel conversion circuitry 116 is coupled to the output of the receiver circuitry 114, and the serial-to-parallel conversion circuitry 116 generally represents the circuitry, logic, and/or hardware components of the second computing module 104 that are configured to convert the serialized data from the receiver circuitry 114 to parallel data that is synchronized with the clock domain of the processing system 118. The processing system 118 generally represents the main processing core for the second computing module 104, and the processing system 118 is coupled to the output of the serial-to-parallel conversion circuitry 116 and configured to receive and/or act upon the data from the serial-to-parallel conversion circuitry 116 in a conventional manner. Depending on the embodiment, the processing system 118 may be realized using one or more ALUs, one or more FPUs, one or more memory elements, discrete gate or transistor logic, discrete hardware components, or any combination thereof.

Figure 2:
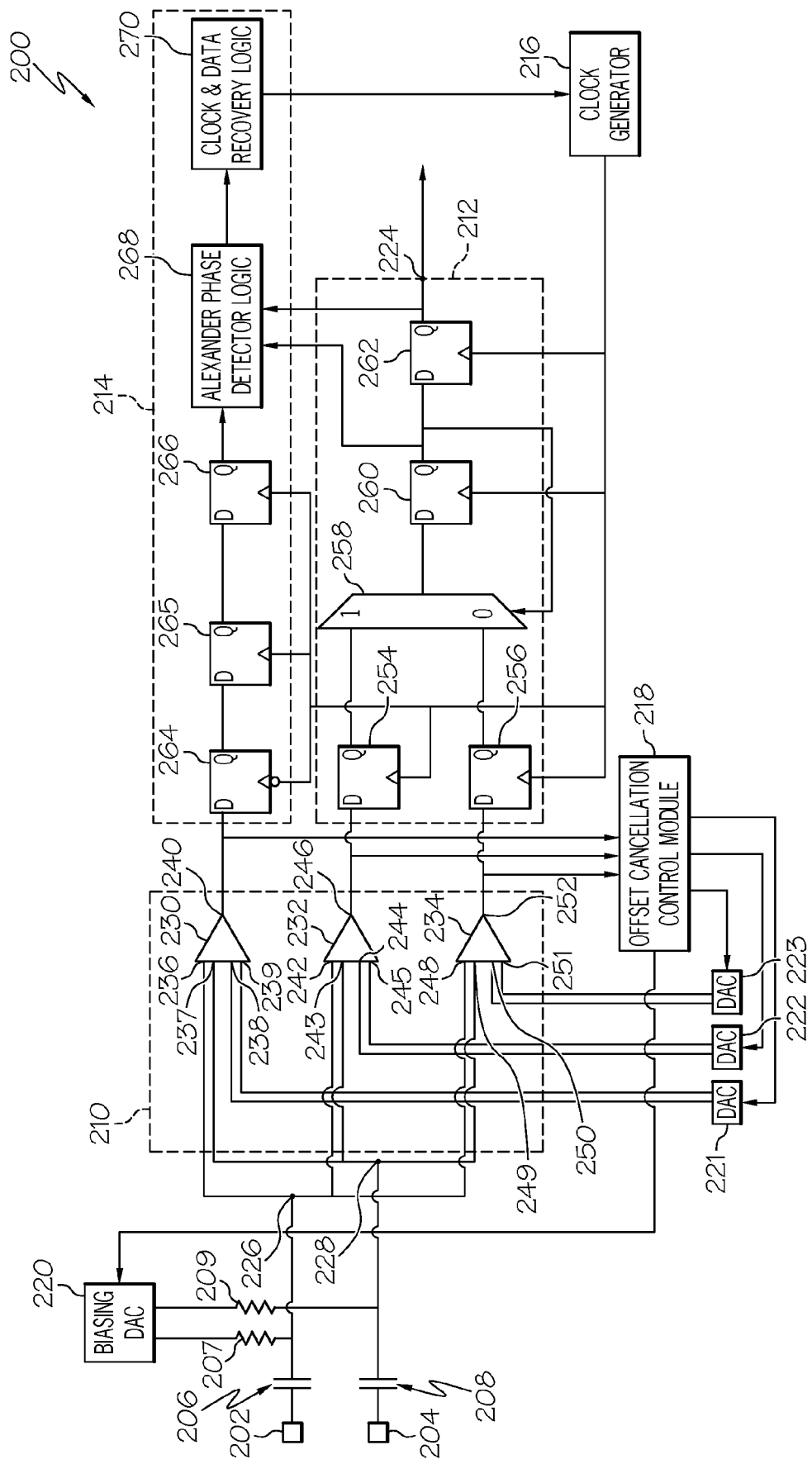
FIG. 2 is a block diagram of receiver circuitry suitable for use in a computing module in the system of FIG. 1 in accordance with one embodiment.

FIG. 2 depicts an exemplary embodiment of receiver circuitry 200 suitable for use as the receiver circuitry 114 in the computing module 104 of system 100 of FIG. 1. The illustrated embodiment of receiver circuitry 200 includes, without limitation, a pair of differential inputs 202, 204, a coupling capacitor arrangement including a pair of coupling capacitors 206, 208, a receiver front end 210, output generation circuitry 212, edge detection circuitry 214, a clock generator 216, an offset cancellation control module 218, and a plurality of digital-to-analog converters (DACs) 220, 221, 222, 223. The elements of the receiver circuitry 200 are suitably configured to produce output data bits at the receiver output node 224 that are indicative of the input signals received at the receiver inputs 202, 204, as will be appreciated in the art and described in greater detail below. In an exemplary embodiment, the offset cancellation control module 218 and DACs 220, 221, 222, 223 are cooperatively configured to calibrate the receiver front end 210 for use with the output generation circuitry 212 and edge detection circuitry 214, as described in greater detail below.

It should be understood that FIG. 2 is a simplified representation of receiver circuitry 200 for purposes of explanation and is not intended to limit the scope or applicability of the subject matter described herein in any way. Thus, although FIG. 2 depicts direct electrical connections between circuit elements, alternative embodiments may employ intervening circuit elements and/or components while functioning in a substantially similar manner. Furthermore, although the receiver circuitry 200 may be described herein in the context of a differential implementation, in practice, the receiver circuitry 200 may be implemented in a single-ended manner. That said, a differential implementation is preferable because it provides improved performance in terms of noise tolerance and power consumption.

In an exemplary embodiment, the receiver inputs 202, 204 are connected to or otherwise configured to receive differential input signals from a differential serial interface (e.g., serial interface 106). In this regard, a first differential input 202 may be connected to or otherwise configured to receive an input signal from the true channel of the serial interface and the second differential input 204 may be connected to or otherwise configured to receive an input signal from the complementary channel of the serial interface. In an exemplary embodiment, when the receiver circuitry 200 is used as the receiver circuitry 114 in the system 100 of FIG. 1, the differential input signals at the receiver inputs 202, 204 are indicative of individual bits of serial data transmitted over the serial interface 106 to the second computing module 104 by the first computing module 102 and/or transmitter circuitry 112.

Referring again to FIG. 2, a first capacitor 206 is coupled electrically in series between the first receiver input 202 and a first input node 226 (or true input node) of the receiver front end 210 and a second capacitor 208 is coupled electrically in series between the other receiver input 204 and an other input node 228 (or complementary input node) of the receiver front end 210. The capacitors 206, 208 function as a high-pass or band-pass filter that removes low frequency components from the signals at differential inputs 202, 204. In this regard, the capacitors 206, 208 may alternatively be referred to as alternating-current (AC) coupling capacitors. In an exemplary embodiment, the capacitors 206, 208 are configured such that they do not attenuate input signals from the serial interface 106 at receiver inputs 202, 204.

In an exemplary embodiment, resistance elements 207, 209 are coupled electrically in series between outputs of the biasing DAC 220 and input nodes 226, 228. The biasing DAC 220 provides substantially equal voltages to input nodes 226, 228 (i.e., a voltage differential of zero between nodes 226, 228) to bias the input nodes 226, 228 to a particular voltage level while receiving data after calibrating the receiver circuitry 200, as described in greater detail below. In this regard, the resistance elements 207, 209 and capacitors 206, 208 provide a low-pass filter that allows the direct current (DC) bias voltage output by the DAC 220 to be applied to input nodes 226, 228 while attenuating or otherwise preventing any high frequency transients or high frequency signals from the outputs of the DAC 220 from influencing the signals at input nodes 226, 228.

In the illustrated embodiment, the receiver front end 210 includes a plurality of amplifier circuits (or amplifiers) 230, 232, 234 coupled to the input nodes 226, 228. As described in greater detail below, in an exemplary embodiment, the amplifiers 232, 234 are calibrated for equalization voltages, and the outputs of amplifiers 232, 234 are coupled to the output generation circuitry 212 which generates an output data bit at the output node 224 indicative of the input signals at receiver inputs 202, 204 by selecting the output of one of the amplifiers 232, 234 based on the preceding output data bit, as described in greater detail below. In an exemplary embodiment, each amplifier 230, 232, 234 includes a first pair of differential inputs coupled to the input nodes 226, 228 for receiving signals indicative of the input signals at receiver inputs 202, 204 and a second pair of differential inputs coupled to the outputs of an associated DAC 221, 222, 223 for receiving a calibrated reference voltage offset, as described in greater detail below. Accordingly, for convenience, but without limitation, the amplifier inputs coupled to input nodes 226, 228 may alternatively be referred to herein as the signal inputs and the amplifier inputs coupled to an associated DAC 221, 222, 223 may alternatively be referred to herein as the reference inputs.

Each amplifier 230, 232, 234 generally represents the circuitry and/or hardware components configured to produce an output signal at its output based on the voltage at its signal input (i.e., the voltage between differential signal inputs) and the voltage at its reference input (i.e., the voltage between differential reference inputs). In this regard, in an exemplary embodiment, each amplifier 230, 232, 234 functions as a dual-differencing amplifier.

For example, in the illustrated embodiment, a first amplifier 230 includes a pair of differential signal inputs 236, 237 coupled to input nodes 226, 228 and a pair of differential reference inputs 238, 239 coupled to the outputs of an associated DAC 221. The first amplifier 230 generates or otherwise produces an output signal at its output 240 based on the voltage difference at signal inputs 236, 237 (i.e., the voltage at input node 226 minus the voltage at node 228) relative to the voltage difference at reference inputs 238, 239 (i.e., the voltage at reference input 238 minus the voltage at reference input 239). In this regard, in accordance with one or more embodiments, the first amplifier 230 has a first inherent (or internal) gain ($G_1$) associated with the signal inputs 236, 237 and a second inherent (or internal) gain ($G_2$) associated with the reference inputs 238, 239. The first amplifier 230 generates an output signal at the output 240 corresponding to a logical high voltage signal (or logic '1') that is indicative of first gain multiplied by the voltage difference between the signal inputs 236, 237 being greater than the second gain multiplied by the voltage difference at the reference inputs 238, 239. In other words, the first amplifier 230 generates a logical high voltage signal at the output 240 when $G_1 V_O - G_2 V_R > 0$, where $V_O$ represents the voltage difference between signal inputs 236, 237 and $V_R$ represents the voltage difference between reference inputs 238, 239. Conversely, the first amplifier 230 generates an output signal at the output 240 corresponding to a logical low voltage signal (or logic '0') that is indicative of first gain multiplied by the voltage difference between the signal inputs 236, 237 being less than the second gain multiplied by the voltage difference at the reference inputs 238, 239 (e.g., when $G_1 V_O - G_2 V_R < 0$). In this regard, when the first gain multiplied by the voltage difference between the signal inputs 236, 237 is substantially equal to the second gain multiplied by the voltage difference at the reference inputs 238, 239 (e.g., $G_1 V_O - G_2 V_R = 0$), the voltage at the reference inputs 238, 239 effectively cancels out the voltage at the signal inputs 236, 237 and the output signal at the output 240 either converges to the midpoint between the logical high voltage and the logical low voltage (e.g., a zero voltage differential at the output 240 in a differential implementation) or alternates between the logical high voltage and the logical low voltage (e.g., in an single-ended implementation). It will be appreciated that in some embodiments, the gains associated with the signal inputs 236, 237 and the reference inputs 238, 239 may be equal (e.g., $G_1 = G_2$), and in such embodiments, a logical high voltage signal at the output 240 is indicative of the voltage difference at signal inputs 236, 237 being greater than the voltage difference at reference inputs 238, 239, and an output signal at the output 240 corresponding to a logical low voltage signal is indicative of the voltage difference between the signal inputs 236, 237 being less than the voltage difference between the reference inputs 238, 239.

In a similar manner, the second amplifier 232 generates an output signal at its output 246 based on the voltage differential at signal inputs 242, 243 coupled to input nodes 226, 228 and the voltage differential at reference inputs 244, 245 coupled to the outputs of an associated DAC 222, and the third amplifier 234 generates an output signal at its output 252 based on the voltage differential at signal inputs 248, 249 coupled to input nodes 226, 228 and the voltage differential at reference inputs 250, 251 coupled to the outputs of an associated DAC 223. It should be appreciated that although FIG. 2 depicts the output 240, 246, 252 of the amplifiers 230, 232, 234 in a single-ended manner for ease of explanation, in practice, the amplifiers 230, 232, 234 may generate or otherwise provide a differential output signal in a conventional manner.

The offset cancellation control module 218 generally represents the circuitry, logic, and/or hardware components configured to calibrate the reference voltage offsets applied by the DACs 221, 222, 223 to the reference inputs of the amplifiers 230, 232, 234 in the receiver front end 210. As described in greater detail below in the context of the receiver calibration process 400 of FIG. 4, the offset cancellation control module 218 is coupled to the biasing DAC 220 and is configured to command, signal, instruct or otherwise operate the DAC 220 to apply a target offset voltage (or voltage difference) to the input nodes 226, 228 for calibrating a respective amplifier 230, 232, 234 for that particular offset voltage, thereby setting the voltage at the input nodes 226, 228 to the target offset voltage. The offset cancellation control module 218 calibrates each amplifier 230, 232, 234 by adjusting a reference voltage offset provided by its associated DAC 221, 222, 223 while the biasing DAC 220 maintains the desired target voltage offset at input nodes 226, 228 until the output signal at the output 240, 246, 252 of the respective amplifier 230, 232, 234 is indicative of the reference voltage offset provided by its respective DAC 221, 222, 223 cancelling out the target voltage offset provided at input nodes 226, 228. As set forth above and described in greater detail below, the output signal of a respective amplifier 230, 232, 234 is indicative of the reference voltage offset provided by its respective DAC 221, 222, 223 cancelling out the target voltage offset at input nodes 226, 228 when a gain associated with its signal inputs multiplied by the target voltage offset is substantially equal to a gain associated with its reference inputs multiplied by the reference voltage offset provided by its respective DAC 221, 222, 223 (e.g., $G_1V_O - G_2V_R = 0$). In the illustrated embodiment of FIG. 2, the first amplifier 230 is calibrated for a target voltage offset of zero at input nodes 226, 228 and is used for edge detection, while the second amplifier 232 is calibrated for a positive decision feedback equalization (DFE) voltage offset and the third amplifier 234 is calibrated for a negative DFE voltage offset, thereby allowing the amplifiers 232, 234 to be used to generate output data bits indicative of the input signals at input nodes 226, 228 based on the preceding output data bits, as described in greater detail below.

Figure 3:
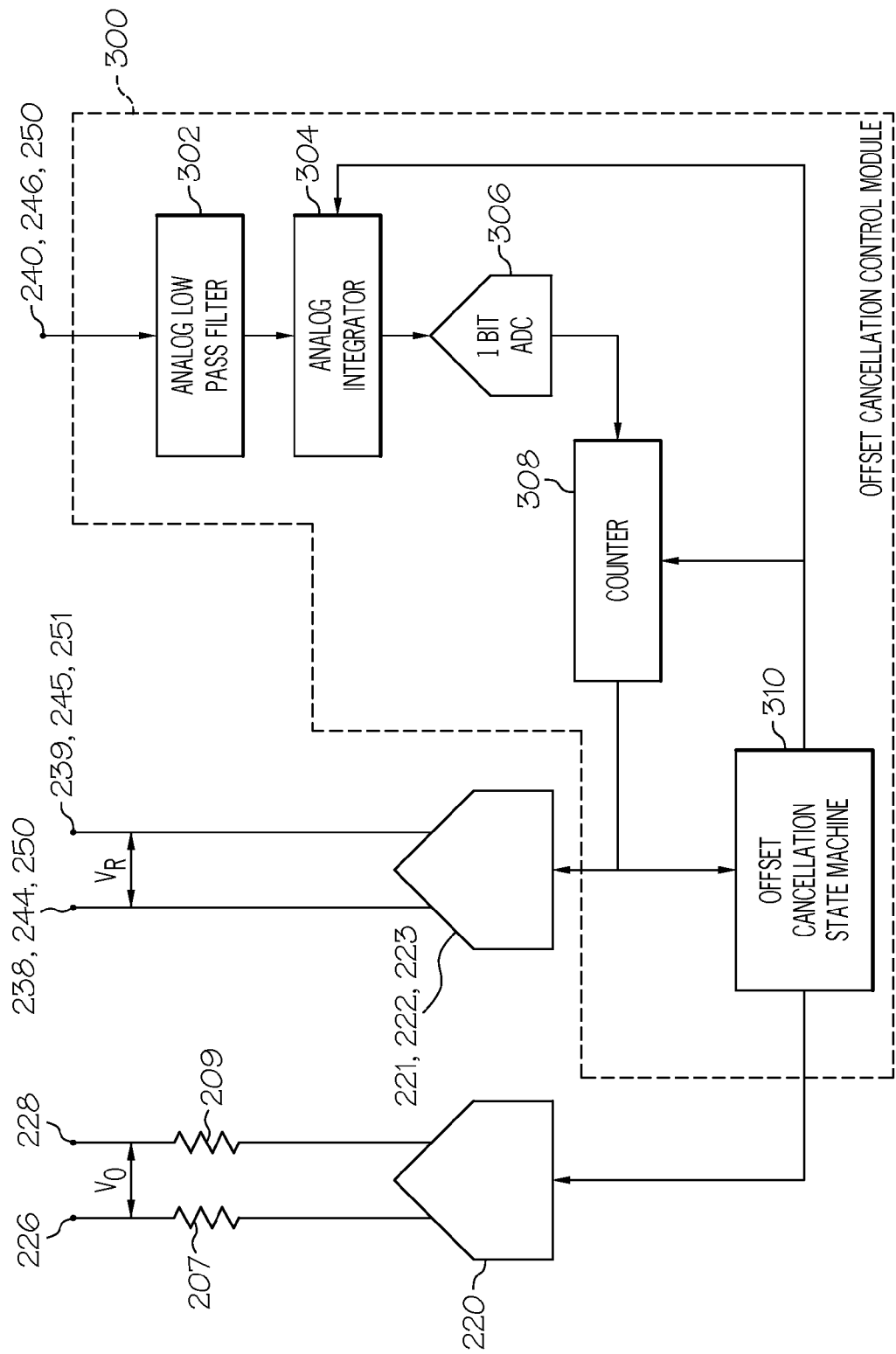
FIG. 3 is a block diagram of an offset cancellation control module suitable for use in the receiver circuitry of FIG. 2 in accordance with one embodiment.

Referring now to FIG. 3, and with continued reference to FIG. 2, an exemplary embodiment of offset cancellation control module 300 suitable for use as the offset cancellation control module 218 in receiver circuitry 200 includes, without limitation, an analog low-pass filter 302, an analog integrator 304, an analog-to-digital converter (ADC) 306, a counter 308, and an offset cancellation state machine 310. The input of the analog low-pass filter 302 is coupled to or otherwise configured to receive the output signal at the output of the amplifier 230, 232, 234 being calibrated, and the filtered output signal from the amplifier 230, 232, 234 being calibrated is provided to the input of the analog integrator 304. The output of the analog integrator 304 is input to the one-bit ADC 306, wherein the output of the ADC 306 provides a signal that controls whether the digital value of the counter 308 is incremented or decremented. The digital value of the counter 308 is used by the offset cancellation state machine 310 and/or offset cancellation control module 300 to control the voltage differential ($V_R$) being output by the DAC 221, 222, 223 to the reference inputs of the amplifier 230, 232, 234 being calibrated (e.g., by providing the digital value of the counter 308 to the digital input of a respective DAC 221, 222, 223). In this regard, when the output signal of the amplifier 230, 232, 234 being calibrated is a logical high voltage value (or logic '1'), the output of the ADC 306 provides a logical high signal to increment the digital value of the counter 308, and thereby, increase the voltage being output by the DAC 221, 222, 223. Conversely, when the output signal of the amplifier 230, 232, 234 being calibrated is a logical low voltage value (or logic '0'), the output of the ADC 306 provides a logical low signal to decrement the digital value of the counter 308, and thereby, decrease the voltage being output by the DAC 221, 222, 223.

In an exemplary embodiment, the characteristics of the low-pass filter 302 and the integrator 304 are cooperatively configured such that when the output signal at the input of the low-pass filter 302 is indicative of the voltage differential ($V_R$) at the reference inputs of a respective amplifier 230, 232, 234 being substantially equal to the offset voltage ($V_O$) being provided by the biasing DAC 220, the digital value of the counter 308 achieves a steady-state or constant value. In this regard, the amplifier output signal may converge to a logical midpoint voltage level or toggle between a logical high voltage signal and a logical low voltage signal when the voltage differential at its reference inputs ($V_R$) is sensed or otherwise perceived by the amplifier as being substantially equal to the offset voltage ($V_O$) or otherwise cancelling out the offset voltage (e.g., when $G_1V_O - G_2V_R = 0$). As set forth below, the offset cancellation state machine 310 stores or otherwise maintains the digital value of the counter 308 (or maintains the digital value at a digital input of a respective DAC 221, 222, 223) to maintain the voltage differential output by the DAC 221, 222, 223 of the amplifier 230, 232, 234 being calibrated at a constant voltage during subsequent operation of the receiver circuitry 200.

Referring again to FIG. 2, as illustrated, the output generation circuitry 212 includes a flip-flop 254 having its input coupled to the output 246 of the second amplifier 232 and a second flip-flop 256 having its input coupled to the output 252 of the third amplifier 234. The outputs of the flip-flops 254, 256 are provided to the inputs of a two-to-one multiplexer 258. As illustrated, the output of the flip-flop 256 coupled to the amplifier 234 calibrated for the negative DFE voltage is provided to the logic '0' input of the multiplexer 258, and the output of the flip-flop 254 coupled to the amplifier 232 calibrated for the positive DFE voltage is provided to the logic '1' input of the multiplexer 258. The output of the multiplexer 258 is provided to another flip-flop 260 having its output fed back to the selection input of the multiplexer 258. When the input signals at input nodes 226, 228 correspond to a logical low signal (or logic '0'), the output of flip-flop 260 will be a logic '0', and thereby, the negative DFE amplifier 234 will be selected by multiplexer 258 for use in receiving subsequent input signals at input nodes 226, 228. This reduces the impact of ISI when a logic '1' data bit is transmitted after a long stream of logic '0' data bits by selecting the amplifier 234 of the receiver front end 210 having a lower threshold voltage (e.g., the negative DFE voltage differential at inputs 250, 251), thereby making it easier to receive a logic '1' input signal at input nodes 226, 228 that has a reduced amplitude. Conversely, when the input signals at input nodes 226, 228 correspond to a logical high signal (or logic '1'), the output of flip-flop 260 will be a logic '1', and thereby, the positive DFE amplifier 232 is selected by multiplexer 258 for use in receiving the signals at input nodes 226, 228. This reduces the impact of ISI when a logic '0' data bit is transmitted after a long stream of logic '1' data bits by selecting the amplifier 232 of the receiver front end 210 having a higher threshold voltage, thereby making it easier to receive a logic '0' signal at input nodes 226, 228. The output of the flip-flop 260 is provided to the input of another flip-flop 262, and the output of flip-flop 262 corresponds to the output data bits at the receiver output node 224 provided to another component of the computing module 104 (e.g., the serial-to-parallel conversion circuitry 116 and/or processing system 118).

In the illustrated embodiment, the edge detection circuitry 214 includes a first flip-flop 264 having its input coupled to the output 240 of the first amplifier 230, and the output of the flip-flop 264 is coupled to the input of a second flip-flop 265, which, in turn, has its output coupled to the input of a third flip-flop 266. The output of the flip-flop 266 is provided to Alexander phase detector logic 268, which receives the outputs of flip-flops 260, 262. The Alexander phase detector logic 268 generates phase detection signals indicative of the phase difference between the output of the flip-flop 266 relative to the outputs of flip-flops 260, 262. The phase detection signals are provided to clock and data recovery (CDR) logic 270. The CDR logic 270 generally represents the circuitry, logic, and/or hardware components configured to adjust the phase of a clock signal generated by the clock generator 216 based on the phase detection signals provided by the Alexander phase detector logic 268. In this regard, the Alexander phase detector logic 268 signals the CDR logic 270 to adjust the phase of the generated clock signal forward in time when the output of flip-flop 266 matches the output of flip-flop 262, and alternatively, signals the CDR logic 270 to adjust the phase of the generated clock signal backward in time when the output of flip-flop 266 matches the output of flip-flop 260. The clock generator 216 generally represents the circuitry, logic, and/or hardware components configured to generate the clock signal having a phase that is determined by the CDR logic 270, as described above. As illustrated, the clock signal generated by the clock generator 216 is used to clock the flip-flops of the output generation circuitry 212 and the edge detection circuitry 214. In this regard, flip-flop 264 is clocked on falling edge of the generated clock signal which corresponds to the expected edge of (or transition between) data bits received at the receiver inputs 202, 204.

Figure 4:
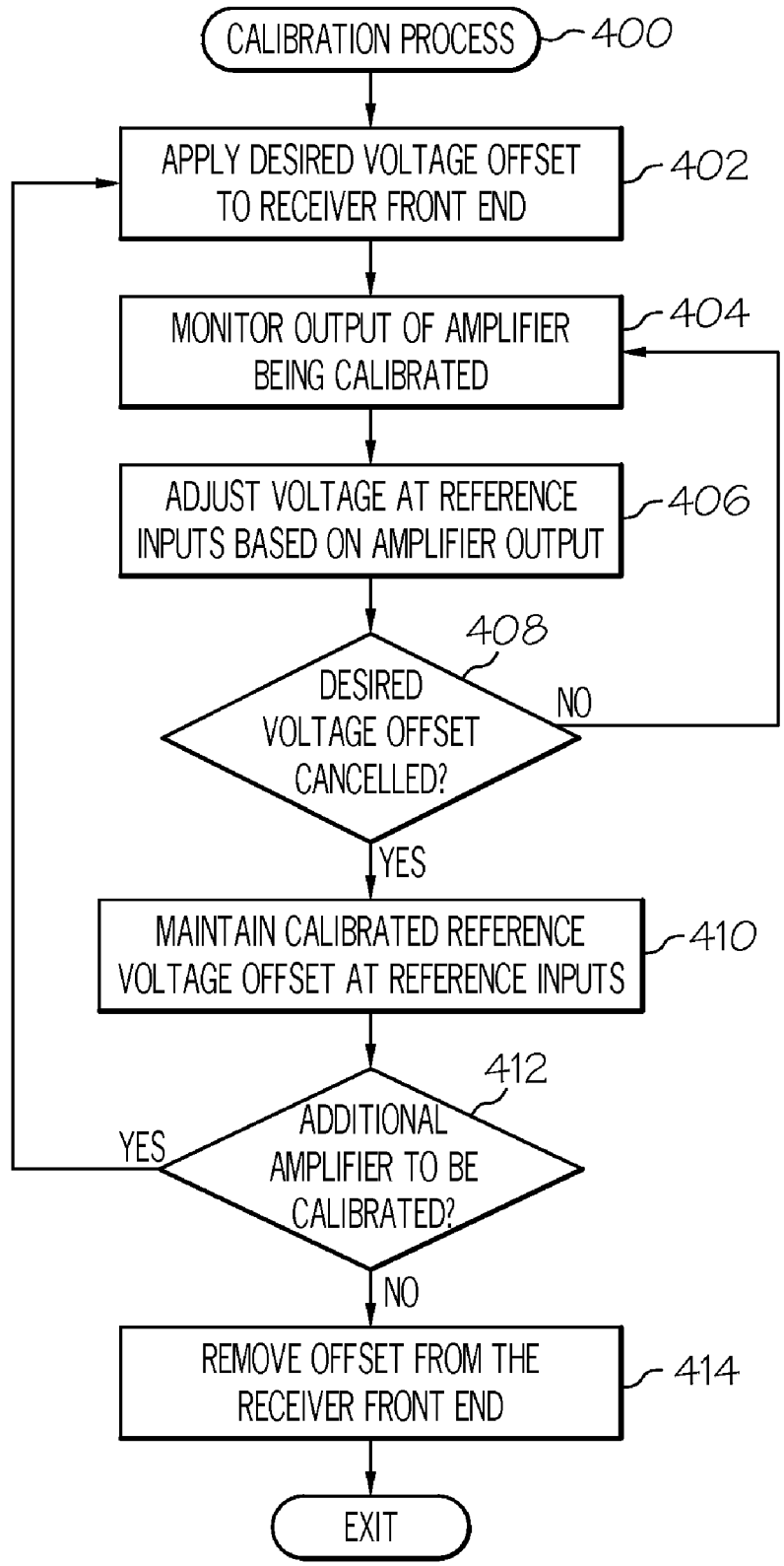
FIG. 4 is a calibration process suitable for use with the receiver circuitry of FIG. 2 in accordance with one or more embodiments.

Referring now to FIG. 4, in an exemplary embodiment, receiver circuitry of a computing module (e.g., receiver circuitry 114, 200 of computing module 104) may be configured to perform a calibration process 400 and additional tasks, functions, and operations described below. The various tasks may be performed by software, hardware, firmware, or any combination thereof. For illustrative purposes, the following description may refer to elements mentioned above in connection with FIGS. 1-3. In practice, the tasks, functions, and operations may be performed by different elements of the described system, such as the offset cancellation control module 218, 300, the biasing DAC 220, the DACs 221, 222, 223, the low-pass filter 302, the integrator 304, the ADC 306, the counter 308, the offset cancellation state machine 310, and/or the amplifiers 230, 232, 234. It should be appreciated that any number of additional or alternative tasks may be included, and may be incorporated into a more comprehensive procedure or process having additional functionality not described in detail herein.

Referring now to FIG. 4, and with continued reference to FIGS. 1-3, the receiver calibration process 400 may be performed to calibrate the receiver upon initialization of the receiver or in response to identifying a recalibration condition, as described in greater detail below. The receiver calibration process 400 begins by applying a desired (or targeted) voltage offset to the input of the receiver front end to initially calibrate a first amplifier in the receiver front end (task 402). For example, in an exemplary embodiment, the offset cancellation control module 218, 300 and/or offset cancellation state machine 310 begins by commanding, signaling, controlling, or otherwise operating the biasing DAC 220 to apply a zero voltage offset at input nodes 226, 228, thereby setting the voltage at the input nodes 226, 228 to a zero voltage offset for calibrating an edge detection amplifier 230. By setting the voltage at input node 226 substantially equal to the voltage at node 228, the offset cancellation control module 218, 300 provides a zero voltage offset (or a voltage differential equal to zero) to the signal inputs of the amplifier 230 in the receiver front end 210 being calibrated for edge detection.

After applying the desired voltage offset to the receiver front end, the calibration process 400 continues by monitoring the output signal at the output of the amplifier being calibrated and adjusting the voltage at the reference inputs of the amplifier being calibrated until the output signal is indicative of the voltage differential at the reference inputs cancelling out the target voltage offset applied to the input of the receiver front end (tasks 404, 406, 408). In an exemplary embodiment, the offset cancellation state machine 310 resets the value of the counter 308 to zero and commands, signals, or otherwise operates the respective DAC 221, 222, 223 to provide a voltage differential of zero to the reference inputs of the respective amplifier 230, 232, 234. For example, the offset cancellation state machine 310 and/or offset cancellation control module 218, 300 may command, signal, or otherwise operate the DAC 221 to apply a zero voltage differential across reference inputs 238, 239. As described above, the low-pass filter 302, integrator 304, and ADC 306 are configured to monitor the output signal at output 240 of the amplifier 230, and adjust the reference voltage differential at reference inputs 238, 239 by incrementing/decrementing the value of the counter 308 based on the output signal. In one embodiment, the offset cancellation state machine 310 identifies or otherwise determines that output signal at output 240 is indicative of the reference voltage differential at the reference inputs 238, 239 cancelling out the target voltage offset at signal inputs 236, 237 by monitoring the value of the counter 308 and identifying when the value of the counter 308 achieves a steady-state value. In this regard, the offset cancellation state machine 310 and/or offset cancellation control module 218, 300 increases/decreases the reference voltage offset ($V_R$) provided at reference inputs 238, 239 until the output 240 of the amplifier 230 is indicative of the gain ($G_2$) associated with the reference inputs 238, 239 multiplied by the reference voltage offset ($V_R$) provided at reference inputs 238, 239 being substantially equal to the gain ($G_1$) associated with the signal inputs 236, 237 multiplied by the target voltage offset ($V_O$) at input nodes 226, 228 (e.g., $G_1V_O - G_2V_R = 0$). As described above, when the reference voltage offset ($V_R$) provided at reference inputs 238, 239 cancels out the desired target voltage offset ($V_O$) applied at input nodes 226, 228, the output signal at the output 240 of the amplifier 230 converges to a logical midpoint voltage value or otherwise toggles between a logical high voltage and a logical low voltage, and the counter 308 achieves a substantially steady-state value.

In response to identifying that the output signal is indicative of the reference voltage differential at the reference inputs cancelling out the desired target voltage offset applied to the signal inputs of the amplifier, the calibration process 400 identifies the reference voltage offset (or voltage differential) currently being applied to the reference inputs as the calibrated reference voltage offset and maintains the calibrated reference voltage offset at the reference inputs of the amplifier during subsequent operation of the receiver circuitry (task 410). In this regard, the offset cancellation state machine 310 and/or offset cancellation control module 218, 300 stores or maintains the value of the counter 308 and provides the value to the input of the DAC associated with the calibrated amplifier to provide the calibrated reference voltage offset to the reference inputs of the amplifier during operation of the receiver circuitry 114, 200. For example, for the edge detection amplifier 230, the offset cancellation state machine 310 and/or offset cancellation control module 218, 300 stores or maintains the value of the counter 308 resulting in the output signal at output 240 indicative of the voltage differential at the reference inputs 238, 239 cancelling out the zero voltage offset at input nodes 226, 228. The offset cancellation state machine 310 and/or offset cancellation control module 218, 300 provides the stored value to the input of the DAC 221 to provide the calibrated reference voltage offset to the reference inputs 238, 239 of the amplifier 230 during subsequent operation of the receiver circuitry 114, 200. In this manner, the calibrated reference voltage offset is maintained at the reference inputs 238, 239 of the amplifier 230 throughout operation of the receiver circuitry 114, 200 until the receiver circuitry 114, 200 is powered off or recalibrated.

In an exemplary embodiment, the calibration process 400 continues by identifying or otherwise determining whether any other amplifiers in the receiver front end need to be calibrated (task 412), and repeating the loop defined by tasks 402, 404, 406, 408, 410 and 412 until each amplifier in the receiver front end has been calibrated. For example, referring to FIG. 2, to calibrate the positive DFE amplifier 232, the offset cancellation control module 218, 300 and/or offset cancellation state machine 310 commands, signals, or otherwise operates the biasing DAC 220 to apply a positive DFE voltage offset at input nodes 226, 228 (e.g., by increasing the voltage at input node 226 by half of the DFE voltage and decreasing the voltage at node 228 by half of the DFE voltage), thereby setting the voltage at the signal inputs 242, 243 to the positive DFE voltage offset (task 402). The offset cancellation control module 218, 300 and/or offset cancellation state machine 310 resets the value of the counter 308 to zero, thereby causing the DAC 222 associated with the positive DFE amplifier 232 to provide a voltage differential of zero to the reference inputs 244, 245. As described above, the offset cancellation control module 218, 300 adjusts the voltage output of the DAC 222 until the output signal at output 246 is indicative of the reference voltage differential at reference inputs 244, 245 cancelling out the target voltage differential at signal inputs 242, 243 (e.g., the positive DFE voltage offset at nodes 226, 228) (tasks 404, 406, 408). In response to identifying the output signal at output 246 is indicative of the reference voltage differential at the reference inputs 244, 245 cancelling out the positive DFE voltage differential at the signal inputs 242, 243, the offset cancellation control module 218, 300 and/or offset cancellation state machine 310 stores or maintains the value of the counter 308 and provides the value to the input of the DAC 222 to provide the calibrated reference voltage offset to the reference inputs 244, 245 of the amplifier 232 during subsequent operation of the receiver circuitry 114, 200 (task 410).

In a similar manner, to calibrate the negative DFE amplifier 234, a negative DFE voltage offset is applied to input nodes 226, 228 (e.g., by decreasing the voltage at input node 226 by half of the DFE voltage and increasing the voltage at node 228 by half of the DFE voltage), and the offset cancellation control module 218, 300 adjusts the voltage output of the DAC 223 until the output signal at output 252 is indicative of the reference voltage differential at reference inputs 250, 251 cancelling out the negative DFE voltage differential at signal inputs 248, 249 (tasks 402, 404, 406, 408). The offset cancellation control module 218, 300 and/or offset cancellation state machine 310 stores or maintains the value of the counter 308 and provides the value to the input of the DAC 223 to provide the calibrated reference voltage offset to the reference inputs 250, 251 of the amplifier 234 during operation of the receiver circuitry 114, 200 (task 410).

Referring again to FIG. 4, in an exemplary embodiment, after all of the amplifiers of the receiver front end have been calibrated, the calibration process 400 continues by removing any voltage offset at the input of the receiver front end (task 414). In this regard, the offset cancellation control module 218, 300 and/or offset cancellation state machine 310 commands or otherwise operates the DAC 220 to provide a zero offset voltage across input nodes 226, 228, that is, the voltage at input node 226 is substantially equal to the voltage at node 228. After the voltage offset is removed from input nodes 226, 228, the receiver circuitry 114, 200 receives data from the serial interface 106 at differential inputs 202, 204 in a conventional manner. As described above, the output generation circuitry 212 implements a DFE scheme, such that the DFE voltage offset is effectively added or subtracted from the input signals at input nodes 226, 228 (e.g., by selecting an amplifier 232, 234 with a higher or lower threshold voltage differential) to mitigate any ISI over the serial interface 106. In an exemplary embodiment, the receiver circuitry 114, 200 is operated to receive data over the serial interface 106 at receiver inputs 202, 204 until being powered off or a recalibration condition indicative of need to recalibrate the amplifiers 230, 232, 234 of the receiver front end 210 is identified. For example, the processing system 118 or another component of the computing module 104 may identify a recalibration condition in response to identifying or otherwise determining that a bit error rate of the data received at the receiver output node 224 of the receiver circuitry 114, 200 is greater than a threshold bit error rate value. In response to identifying a recalibration condition, the processing system 118 or another component of the computing module 104 may reset the offset cancellation state machine 310 or otherwise signal the offset cancellation control module 218, 300 to repeat the calibration process 400 to recalibrate the amplifiers 230, 232, 234 of the receiver front end 210.

To briefly summarize, one advantage of the receiver circuitry and calibration methods described above is that amplifier circuits in the receiver front end may be calibrated for various predetermined offset voltages in a repeatable and accurate manner without adding resistance or parasitic capacitances to the input signal path. Furthermore, the calibrated reference voltage offsets may be applied to the amplifier circuits without affecting the voltage level of the input signals from the serial interface, and the biasing DAC may be used to bias the receiver circuit to a desired operating point without affecting the calibrated reference voltage offsets.

For the sake of brevity, conventional techniques related to receiver circuits, equalization schemes, circuit design, differential signaling, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A receiver circuit comprising:
a first amplifier configured to generate an output signal based on a first voltage and a reference voltage; and
a control module coupled to the first amplifier, wherein the control module is configured to:
set the first voltage to a first target offset voltage; and
while the first voltage is equal to the first target offset voltage:
adjust the reference voltage based on the output signal; and
identify a first calibrated reference voltage offset for the first amplifier when the output signal is indicative of the reference voltage cancelling the first target offset voltage, wherein the reference voltage cancels the first target offset voltage when a difference between a first gain multiplied by the first target offset voltage and a second gain multiplied by the reference voltage is substantially equal to zero.

2. A receiver circuit comprising:
a first amplifier configured to generate an output signal based on a first voltage and a reference voltage; and
a control module coupled to the first amplifier;
a first digital-to-analog converter (DAC) coupled to the first amplifier and the control module, the first DAC being configured to provide the first voltage; and
a second DAC coupled to the first amplifier and the control module, the second DAC being configured to provide the reference voltage, wherein the control module is configured to:
operate the first DAC to set the first voltage equal to a first target offset voltage; and
while the first voltage is equal to the first target offset voltage:
operate the second DAC to adjust the reference voltage based on the output signal; and
identify a first calibrated reference voltage offset for the first amplifier as the reference voltage applied by the second DAC when the output signal is indicative of the reference voltage cancelling the first target offset voltage.

3. The receiver circuit of claim 2, wherein:
the control module is configured to:
operate the second DAC to increase the reference voltage when the output signal is indicative of a first gain multiplied by the first target offset voltage being greater than a second gain multiplied by the reference voltage; and
operate the second DAC to decrease the reference voltage when the output signal is indicative of the first gain multiplied by the first target offset voltage being less than the second gain multiplied by the reference voltage; and
the reference voltage cancels the first target offset voltage when a difference between the first gain multiplied by the first voltage and the second gain multiplied by the reference voltage is substantially equal to zero.

4. The receiver circuit of claim 2, further comprising:
a receiver input configured to receive an input signal;
an input node coupled between the first DAC and the first amplifier; and
a capacitor coupled electrically in series between the receiver input and the input node.

5. The receiver circuit of claim 4, further comprising a resistance element coupled electrically in series between the first DAC and the input node.

6. The receiver circuit of claim 4, further comprising:
a third DAC configured to provide a second reference voltage; and
a second amplifier coupled to the first DAC at the input node and the third DAC, the second amplifier being configured to generate a second output signal based on the first voltage and the second reference voltage, wherein the control module is coupled to the third DAC, and the control module is configured to:
operate the first DAC to provide the first voltage equal to a second target offset voltage;
operate the third DAC to adjust the second reference voltage based on the second output signal; and
identify a second calibrated reference voltage offset for the second amplifier corresponding to the second reference voltage applied by the third DAC when the second output signal is indicative of the second reference voltage cancelling the second target offset voltage.

7. The receiver circuit of claim 6, wherein the control module is configured to:
operate the second DAC to maintain the reference voltage provided by the second DAC equal to the first calibrated reference voltage offset; and
operate the third DAC to maintain the second reference voltage provided by the third DAC equal to the second calibrated reference voltage offset.

8. The receiver circuit of claim 7, wherein:
the first target offset voltage corresponds to a positive equalization voltage;
the second target offset voltage corresponds to a negative equalization voltage; and
the receiver circuit further comprises output generation circuitry configured to:
provide the output signal from the first amplifier to an output node in response to a logical high input signal previously received at the receiver input; and
provide the second output signal from the second amplifier to the output node in response to a logical low input signal previously received at the receiver input.

9. A computing module comprising:
receiver circuitry including:
an input for receiving an input signal;
a first digital-to-analog converter (DAC) configured to provide a calibrated reference voltage offset;
an amplifier circuit having a signal input coupled to the input, a reference input coupled to the first DAC, and an output, the amplifier circuit being configured to generate an output signal at the output based on the input signal at the signal input and the calibrated reference voltage offset at the reference input; and a capacitor arrangement configured electrically in series between the input and the amplifier circuit; and a processing system configured to receive the output signal from the receiver circuitry.

10. A computing module comprising:

receiver circuitry including:

an input for receiving an input signal;

a first digital-to-analog converter (DAC) configured to provide a calibrated reference voltage offset;

an amplifier circuit having a pair of signal inputs coupled to the input, a pair of reference inputs coupled to the first DAC, and an output, the amplifier circuit being configured to generate an output signal at the output based on a first voltage at the pair of signal inputs and the calibrated reference voltage offset at the pair of reference inputs; and a capacitor arrangement configured electrically in series between the input and the amplifier circuit; and a processing system configured to receive the output signal from the receiver circuitry.

11. The computing module of claim 10, further comprising:

a second DAC coupled to the pair of signal inputs; and a control module coupled to the output of the amplifier circuit, the first DAC, and the second DAC, wherein the control module is configured to:

command the second DAC to provide an equalization offset voltage at the pair of signal inputs;

operate the first DAC to adjust the calibrated reference voltage offset provided by the first DAC based on the output signal; and operate the first DAC to maintain the calibrated reference voltage offset constant in response to identifying the output signal is indicative of the equalization offset voltage being cancelled by the calibrated reference voltage offset; and command the second DAC to remove the equalization offset voltage at the pair of signal inputs while maintaining the calibrated reference voltage offset constant.

12. The computing module of claim 11, the amplifier circuit having a first gain associated with the pair of signal inputs and a second gain associated with the pair of reference inputs, wherein:

the amplifier circuit is configured to generate the output signal based on a difference between the first gain multiplied by the equalization offset voltage and the second gain multiplied by the calibrated reference voltage offset; and the equalization offset voltage is cancelled by the calibrated reference voltage offset when the difference between the first gain multiplied by the equalization offset voltage and the second gain multiplied by the calibrated reference voltage offset is equal to zero.

13. The computing module of claim 11, wherein:

the input comprises a pair of differential inputs including first receiver input and a second receiver input;

the capacitor arrangement includes:

a first capacitor configured electrically in series between the first receiver input and a first input node coupled to a first signal input of the pair of signal inputs; and a second capacitor configured electrically in series between the second receiver input and a second input node coupled to a second signal input of the pair of signal inputs;

the second DAC is configured to provide the equalization offset voltage between the first input node and the second input node;

a first resistance element is coupled electrically in series between the second DAC and the first input node; and a second resistance element is coupled electrically in series between the second DAC and the second input node.

14. A method for operating a receiver circuit, the method comprising:

applying a first voltage offset to a first input of an amplifier circuit, the first input including a first differential signal input and a second differential signal input, the first voltage offset corresponding to a voltage difference between the first differential signal input and the second differential signal input;

generating an output signal at an output of the amplifier circuit based on a difference between a first gain multiplied by the first voltage offset and a second gain multiplied by a second voltage offset at a second input of the amplifier circuit, the second input including a first reference input and a second reference input, the second voltage offset corresponding to a voltage difference between the first reference input and the second reference input, wherein the first gain is associated with the first input and the second gain is associated with the second input;

adjusting the second voltage offset based on the output signal; and maintaining the second voltage offset at a constant voltage when the output signal is indicative of the second voltage offset cancelling the first voltage offset.

15. The method of claim 14, wherein:

the receiver circuit includes:

a first differential input node coupled to the first differential signal input;

a second differential input node coupled to the second differential signal input;

differential receiver inputs comprising a first receiver input and a second receiver input;

a first capacitor coupled electrically in series between the first receiver input and the first differential input node;

a second capacitor coupled electrically in series between the second receiver input and the second differential input node; and applying the first voltage offset comprises applying the first voltage offset between the first differential input node and the second differential input node.

16. The method of claim 15, further comprising:

applying a third voltage offset between the first differential input node and the second differential input node, the first differential input node being coupled to a first differential signal input of a second amplifier circuit and the second differential input node being coupled to a second signal input of the second amplifier circuit;

generating a second output signal at an output of the second amplifier circuit based on the third voltage offset and a fourth voltage offset between a first reference input of the second amplifier circuit and a second reference input of the second amplifier circuit;

adjusting the fourth voltage offset based on the second output signal; and maintaining the fourth voltage offset at a constant voltage when the second output signal is indicative of the fourth voltage offset cancelling the third voltage offset.

17. The method of claim 16, the first voltage offset corresponding to a positive equalization voltage and the third voltage offset corresponding to a negative equalization voltage, wherein the method further comprises:

applying a zero voltage offset between the first differential input node and the second differential input node while maintaining the second voltage offset and the fourth voltage offset;

generating an output bit indicative of an input signal at the differential receiver inputs based on the output signal at the output of the amplifier circuit in response to a preceding output bit corresponding to a logical high signal; and generating the output bit indicative of the input signal at the differential receiver inputs based on the second output signal at the output of the second amplifier circuit in response to the preceding output bit corresponding to a logical low signal.

* * * * *